(12) United States Patent
Tsuchiya et al.

(10) Patent No.: US 6,810,888 B2
(45) Date of Patent: Nov. 2, 2004

(54) WAFER ROTARY HOLDING APPARATUS AND WAFER SURFACE TREATMENT APPARATUS WITH WASTE LIQUID RECOVERY MECHANISM

(75) Inventors: Masato Tsuchiya, Gunma-ken (JP); Shunichi Ogasawara, Gunma-ken (JP); Hideyuki Murooka, Gunma-ken (JP)

(73) Assignee: Mimasu Semiconductor Industry Co., Ltd., Gunma-gun (JP)

( * ) Notice: Subject to any disclaimer, the term of this patent is extended or adjusted under 35 U.S.C. 154(b) by 0 days.

(21) Appl. No.: 10/700,546

(22) Filed: Nov. 5, 2003

(65) Prior Publication Data

US 2004/0103931 A1 Jun. 3, 2004

Related U.S. Application Data

(62) Division of application No. 09/650,367, filed on Aug. 29, 2000, now Pat. No. 6,672,318.

(30) Foreign Application Priority Data

| Sep. 9, 1999 | (JP) | 11-255779 |
| Mar. 14, 2000 | (JP) | 2000-070063 |
| Mar. 16, 2000 | (JP) | 2000-073307 |

(51) Int. Cl.$^7$ .............................................. B08B 3/00
(52) U.S. Cl. .................... 134/104.2; 134/109; 134/149; 134/157; 134/902; 156/345.55
(58) Field of Search .................... 134/95.2, 95.3, 134/102.3, 104.2, 109, 137, 149, 153, 155, 157, 902; 118/52, 320, 321, 501; 156/345.11, 345.18, 345.19, 345.51, 345.55

(56) References Cited

U.S. PATENT DOCUMENTS

| 3,523,706 | A | | 8/1970 | Logue |
| 4,903,717 | A | | 2/1990 | Sumnitsch |
| 4,982,694 | A | * | 1/1991 | Moriyama ................... 118/697 |
| 5,492,566 | A | | 2/1996 | Sumnitsch |
| 5,608,943 | A | * | 3/1997 | Konishi et al. ............... 15/302 |
| 5,772,764 | A | * | 6/1998 | Akimoto ..................... 118/319 |
| 5,989,342 | A | * | 11/1999 | Ikeda et al. ................. 118/52 |
| 6,159,288 | A | * | 12/2000 | Satou et al. .................. 118/70 |
| 6,159,291 | A | * | 12/2000 | Morita et al. ............... 118/321 |
| 6,435,200 | B1 | | 8/2002 | Langen |
| 2002/0074020 | A1 | * | 6/2002 | Ono et al. .................... 134/21 |

* cited by examiner

*Primary Examiner*—Frankie L. Stinson
*Assistant Examiner*—Joseph L. Perrin
(74) *Attorney, Agent, or Firm*—Arent Fox PLLC

(57) ABSTRACT

Provided is a wafer rotary holding apparatus by which a reduced pressure is created on an upper surface of a rotary disk by a simple and easy-to-make mechanism with no need of any of a vacuum source apparatus, a compressed air supply apparatus, a compressed gas supply apparatus and other apparatuses in use; a wafer can be held while rotating with no contact to a rear surface thereof; a degree of pressure reduction can be adjusted with ease and even a thin wafer (of 0.1 mm or less in thickness) can be held while rotating with no deformation; and the wafer with a bowing can be held while rotating with no correction of the bowing. A wafer rotary holding apparatus includes: a rotary disk on which a fluid flow path is formed; a through hole formed in a central section of the rotary disk; and a plurality of wafer rests provided on an upper surface of the rotary disk.

4 Claims, 11 Drawing Sheets

WAFER ROTARY HOLDING APPARATUS AND WAFER SURFACE TREATMENT APPARATUS WITH WASTE LIQUID RECOVERY MECHANISM

This is a Divisional of application Ser. No. 09/650,367, filed on Aug. 29, 2000, now U.S. Pat. No. 6,672,318. The disclosure of the prior application is hereby incorporated by reference herein in its entirety.

BACKGROUND OF THE INVENTION

1. Field of the Invention

This invention relates to a wafer rotary holding apparatus that can hold a wafer with no contact to a rear surface of the wafer, using a reduced pressure created by a fluid on an upper surface of a rotary disk, discharged outwardly by centrifugal force due to rotation of the rotary disk, and to a wafer surface treatment apparatus with a waste liquid recovery mechanism that, when a surface of the wafer is treated with a treatment liquid or a cleaning liquid, waste liquids can be separately recovered in an efficient manner according to kinds of the treatment liquid and the cleaning liquid.

2. Description of the Prior Art

In a semiconductor fabrication process, steps of performing various kinds of treatment on a wafer during rotation, such as spin etching, spin drying and spin coating, have increased in recent years. To definitely name apparatuses for such steps, there have been known a spin-etching apparatus, a spin-drying apparatus, a spin-coating apparatus and so on. In such apparatuses of the prior art, the following ways for fixing a wafer have been adopted: a wafer is suction-fixed on a suction-chuck base using a vacuum source, or a wafer is fixed on a suction-chuck base using a vacuum force created there by a compressed air or gas from a supply source.

The prior art apparatuses, however, have required a vacuum source apparatus, a compressed air supply apparatus, a compressed gas supply apparatus and so on, which are additionally provided thereto, thereby resulting in cost increase due to installment thereof. In addition to the cost increase, there has arisen another problem because of hardship in adjustment of degrees of reduction or increase of pressure, which leads to a phenomenon that a wafer is deformed, for example, sagged under an influence of a pressure in the case where the wafer as thin as to be easy to be affected by the pressure, for example of a thickness of 0.1 mm or less, is fixed.

Further, a wafer as thin as of the order of 100 $\mu$m or less naturally has bow in many cases, and therefore, suction-chuck of the wafer has not been successfully effected because of the bow in the prior art apparatuses described above. For this reason, in the case of a wafer with bow, there has occurred a need for time and labor with which a wafer is corrected on the bow, for a procedure has actually been adopted where the wafer is corrected on the bow and thereafter, the wafer is suction chucked.

As treatment for a surface of a wafer in a device fabrication process, there can be named: etching treatment for removing a damage layer after back side grinding, coating of a photo resist on the wafer, developing of the wafer on which circuit patterns are exposed, a photo resist is coated and semiconductor circuits are printed, cleaning of a surface of the wafer and so on.

An apparatus for use in the wafer surface treatment includes: a wafer rotary holding apparatus which chucks and rotates a wafer; a treatment liquid supply means supplying a necessary treatment liquid (a chemical liquid) onto the upper surface of the chucked wafer; a cleaning liquid supply means supplying a cleaning liquid onto the upper surface of the wafer; and other means (for example, Japanese patent Laid-open Publication No. 8-88168).

Etching for removing a damage layer after a prior art back side grinding, for example, has sufficiently been concluded with one time of usage of a mixed acid (for example, hydrofluoric acid, nitric acid and so on) and in this case, it is only required after the etching to recover the used treatment liquid (for example, the used mixed acid) and the used cleaning liquid as disclose in the above publication.

At present, however, a necessity has already showed up of surface quality improvement after the above described etching and it has been common to effect one or more times of additional etching for surface quality improvement following the first etching described above. With plural times of surface treatment in this way, a new problem has occurred since a process time becomes totally longer due to the surface treatment, thereby leading to reduction in productivity. Further, since a plurality of treatment liquids (chemical liquids) are in use, a necessity has arisen of an apparatus by which three (3) or more kinds of waste liquids can be recovered, wherein requirement is beyond a capacity of a prior art apparatus by which only two (2) kinds of waste liquids including one kind of a treatment liquid and a cleaning liquid are recovered.

Further, on the other hand, while there has be required single side treatment in recent years in the case where a very thin wafer of 100 $\mu$m or less in thickness is etched or cleaned, a rotary holding means of a novel type has been desired in order to cope with such a requirement since it is difficult to hold a wafer while rotating with prior art means that holds a wafer while rotating by suction-chucking the lower surface thereof.

SUMMARY OF THE INVENTION

The present invention was made in light of the above described problems of the prior art. Accordingly, the invention has two objects: one is to provide a wafer rotary holding apparatus by which a reduced pressure is created on an upper surface of a rotary disk by a simple and easy-to-make mechanism with no need of any of a vacuum source apparatus, a compressed air supply apparatus, a compressed gas supply apparatus and other apparatuses in use; a wafer can be held while rotating with no contact to a rear surface thereof; a degree of pressure reduction can be adjusted with ease and even a thin wafer (of 0.1 mm or less in thickness) can be held while rotating with no deformation; the wafer with bow can be held while rotating with no correction of the bow; furthermore a very thin wafer of 100 $\mu$m or less in thickness can be held while rotating using only contacts with the periphery of the wafer; and in addition, cleaning using a ultra-sonic jet nozzle and brush cleaning can also be employed, and the other is to provide a wafer surface treatment apparatus having a waste liquid recovery mechanism by which wastes liquids, especially three or more kinds of waste liquids, can be separately recovered in a continuous, efficient manner according to kinds of a treatment liquid and a cleaning liquid and therefore productivity can be increased.

In order to solve the above described problems, the invention is directed to the following apparatuses.

A wafer rotary holding apparatus of the invention includes: a rotary disk on which a fluid flow path is formed; a through hole formed in a central section of the rotary disk;

and a plurality of wafer rests provided on an upper surface of the rotary disk, wherein a wafer is placed on the wafer rests, above the rotary disk with a gap therebetween, and wherein when the rotary disk is rotated, a fluid in the fluid flow path is discharged outwardly by centrifugal force due to rotation; thereby a reduced pressure is created in the fluid flow path and kept as far as the rotary disk is rotated, through a process in which a fluid is drawn by sucking force of the reduced pressure from the lower surface side of the rotary disk through the through hole, and the fluid drawn is supplied onto the upper surface of the rotary disk to be outwardly discharged in a continuous manner passing through the fluid flow path, with the result that the wafer is drawn downwardly by the sucking force of the reduced pressure and fast held on the wafer rests while rotating.

It should be appreciated that there arises an advantage in that even in the case where bow is inherently present in a thin wafer of the order of 100 $\mu$m or less in thickness, when placing and holding the wafer on the wafer rotary holding apparatus as it is, the wafer can be held while rotating with no troubles because the bow is cancelled by centrifugal force due to the rotation.

A wafer rotary holding apparatus of the invention preferably further includes: fluid forcible supply means supplying a fluid forcibly through the through hole from the lower surface side of the rotary disk, wherein the fluid is supplied through the through hole in a forced manner from the lower surface side of the rotary disk while keeping the reduced pressure. With such a construction, there arises an advantage in that a chemical liquid supplied onto the upper surface of the wafer to treat the upper surface thereof can be prevented from creeping over onto the lower surface of the wafer.

A construction is preferable in which straight or curved blades are provided in a radial state, or a single curved blade is provided in a spiral or volute state on the upper surface of the rotary disk and the fluid flow paths or path is formed in spaces between the upper surface of the rotary disk and a lower surface of the wafer, being partitioned by pairs of opposed blades or blade portions.

A construction is also possible in which a rotary shaft through which a hollow section in communication with the through hole is formed along the axial direction thereof is vertically provided on the central section of the lower surface of the rotary disk and when the rotary shaft and the rotary disk are rotated, a fluid taken in by suction from a lower end opening of the hollow section of the rotary shaft is supplied onto the upper surface of the rotary disk passing through the hollow section and the through hole.

If a construction is adopted in which a wafer rotary holding apparatus of the invention further includes pressure reduction control means controlling a reduced pressure in the fluid flow paths by adjusting a degree of opening of the hollow section, mounted at a proper position along the rotary shaft, a trouble such as that the wafer would otherwise be deformed by excessively strong sucking force is completely eliminated since a degree of the reduced pressure can be freely set according to a thickness of the wafer.

The wafer rests can be constructed with lower side guide pins receiving the lower surface of a wafer and outer side guide pins receiving the outer side surface of the wafer. Further, while the wafer rests may be disposed at any positions on the upper surface of a rotary disk as far as a receiving action is not hindered, the wafer rests can advantageously be placed on the upper surfaces of the blades since spaces above the upper surface of the rotary disk can be effectively exploited.

A construction is conceived in which a baffle plate is provided above the through hole formed in the central section of the rotary disk and a fluid supplied onto the upper surface of the rotary disk passing through the through hole is guided in a blade direction by the baffle plate. With such a construction applied, advantages are enjoyed since the fluid does not blow directly to the lower surface of a wafer and therefore, an accident in which the wafer is contaminated with impurities and so on can be prevented from occurring even when impurities or the like are mixed into the fluid, or upward blow-off of the fluid can be prevented from occurring when the wafer is accidentally broken during operation.

If an orientation flat receiver receiving an orientation flat of the wafer or a notch receiver receiving a notch of the wafer is provided on the upper surface of the rotary disk, a wafer is engaged with the upper surface of the rotary disk and therefore, both rotates as one body all time. Consequently, an advantage is enjoyed since even when a chemical liquid or the like liquid is poured onto the upper surface of a wafer held while rotating and a force acts on the wafer in a direction opposite from a direction of rotation, then the wafer continues to rotate in one body with the rotary disk all time with no discrepancy in speed of rotation therebetween, thereby causing no problem due to relative displacement of rotation therebetween, which will be described later.

As the fluid, there can be used: a gas and/or a liquid; that is a gas in a single state, for example air, a liquid in a single state, for example pure water or a chemical liquid, or a mixture thereof.

A wafer surface treatment apparatus with a waste liquid recovery mechanism of the present invention is a wafer surface treatment apparatus treating a surface of a wafer with each of a treatment liquid and a cleaning liquid, including: a wafer rotary holding apparatus holding a to-be-treated wafer while rotating; and a waste liquid recovery mechanism provided around the periphery of the wafer rotary holding apparatus in a vertically movable manner, wherein the waste liquid recovery mechanism is constructed of a plurality of annular waste liquid recovery troughs which are also vertically movable relative to each other or one another and the annular waste liquid recovery troughs are selectively used according to kinds of the treatment liquid and the cleaning liquid, such that the respective waste liquids are separately recovered. By moving upward or downward the above described annular waste liquid recovery troughs in a continuous manner, the treatment liquid and the cleaning liquid which have been used in respective wafer surface treatments can be recovered in a continuous manner, thereby enabling a production efficiency to increase.

With three annular waste liquid recovery troughs in use, there can be enjoyed an advantage in making it possible to recover three kinds of waste liquids.

DETAILED DESCRIPTION OF THE INVENTION

Description will be given of embodiments of the invention below with reference to the accompanying drawings. It should be naturally understood that various modifications or alterations other than the embodiments shown by the drawings can be made in the scope of the invention as far as those do not depart from the technical concept of the invention.

Figure 2:
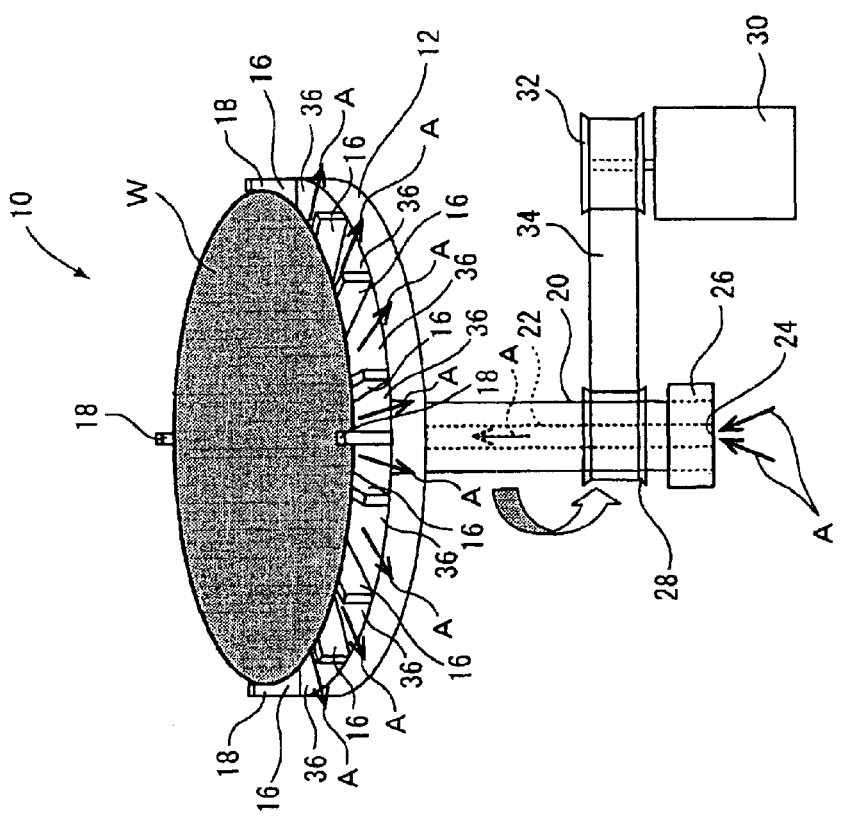
FIG. 2 is a perspective view showing a state of a wafer held during rotation on the wafer rotary holding apparatus of FIG. 1.
Figure 1:
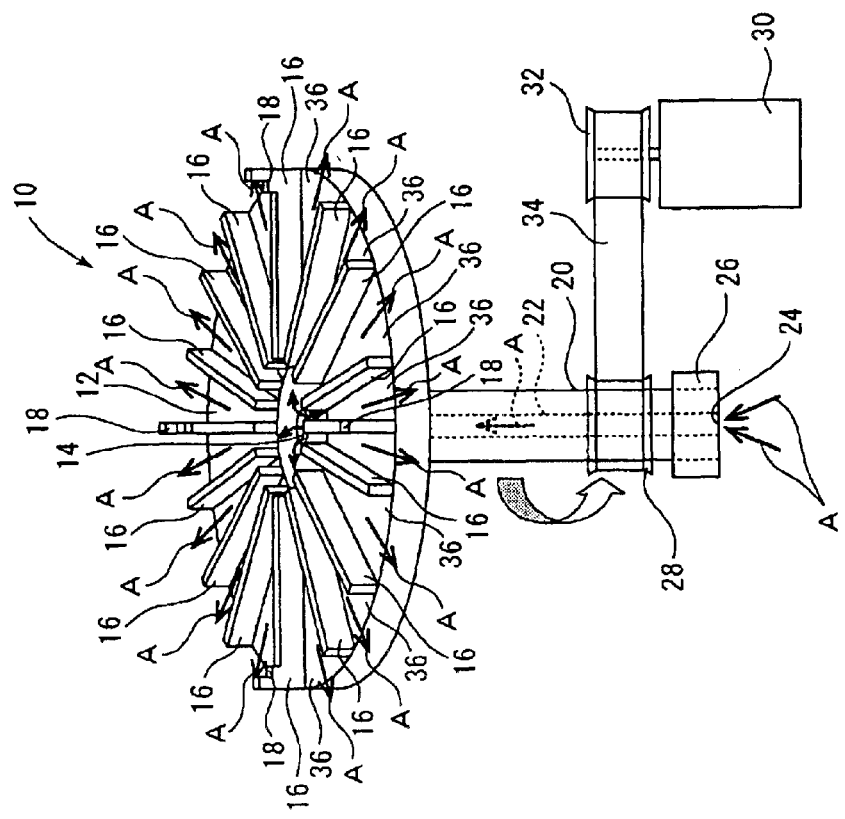
FIG. 1 is a perspective view showing one embodiment of a wafer rotary holding apparatus of the invention.
Figure 3:
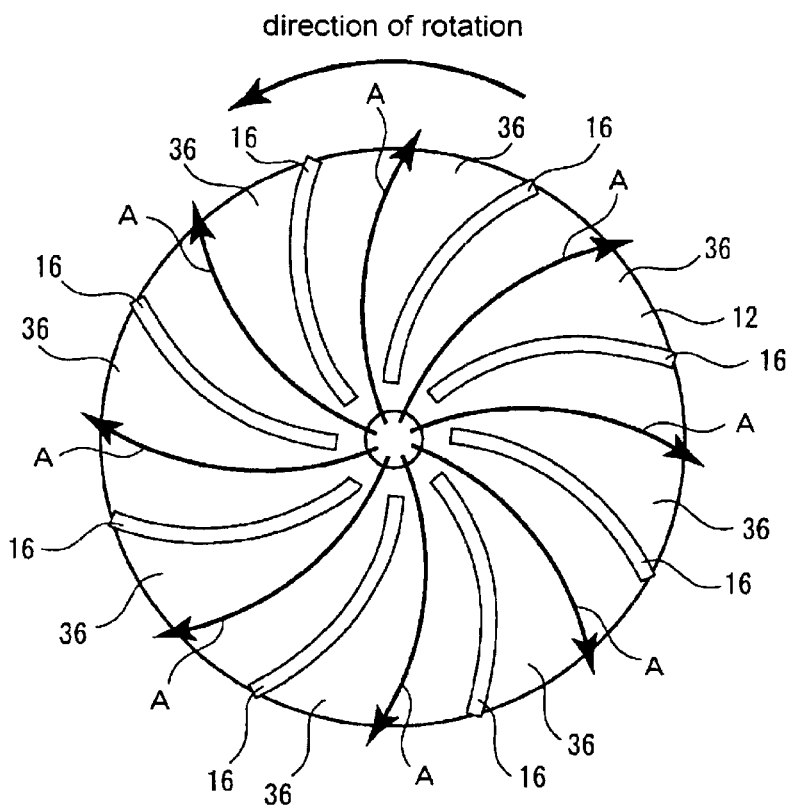
FIG. 3 is a top plan view showing another example of blades.
Figure 4:
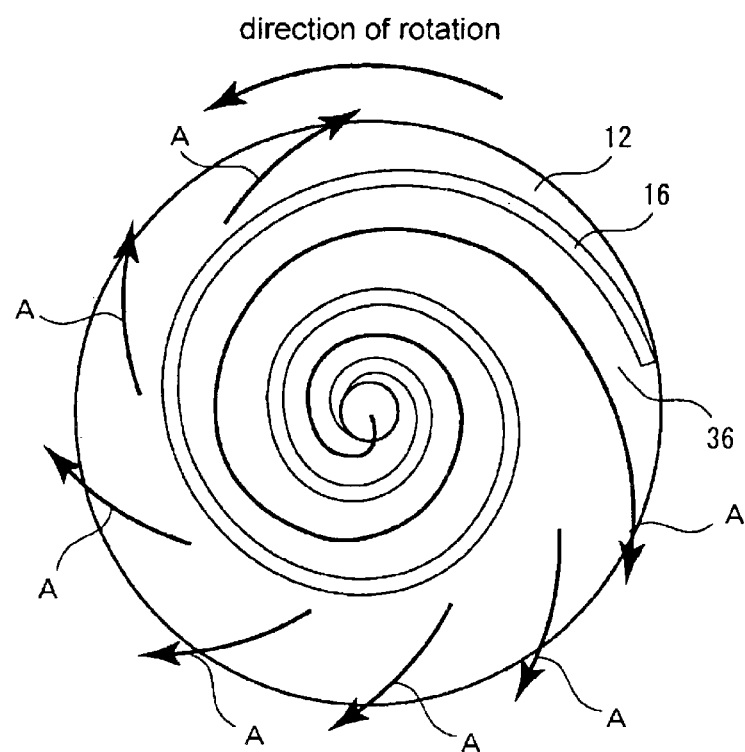
FIG. 4 is a top plan view showing still another example of a blade.

FIG. 1 is a perspective view showing one embodiment of a wafer rotary holding apparatus of the invention, FIG. 2 is a perspective view showing a state of a wafer held during rotation on the wafer rotary holding apparatus of FIG. 1, FIG. 3 is a top plan view showing another example of blades, and FIG. 4 is a top plan view showing still another example of a blade.

In the figures, a numerical mark 10 indicates a wafer rotary holding apparatus, which has a rotary disk 12. A through hole 14 is formed in the central section of the rotary disk 12. On the upper surface of the rotary disk 12, a plurality of blades 16 (16 pieces in this example) are radially disposed at equiangular intervals.

Wafer rests 18 receiving a wafer by the periphery thereof are provided at the respective outer ends of the upper surfaces of the blades 16. While there is no specific limitation on a shape of each of the wafer rests 18 as far as the wafer rests 18 can receive the periphery of the wafer (W), the rest 18 assumes the form of a receiving step in this example. The wafer rests 18 are not necessarily provided on the blades 16 but can be directly provided on the upper surface of the rotary disk 12 provided that no troubles arises. Further, while the number of the wafer rests 18 provided may be the number thereof on which the wafer can be retained even during rotation, for example 3 or more in number, but there is shown a case of 4 in number of the wafer rests 18 disposed symmetrically, in the example of the figures.

A numerical mark 20 indicates a rotary shaft disposed vertically in the central section of the lower surface of the rotary disk 12 and a hollow section 22 in communication with the through hole 14 is formed in the interior of the rotary shaft 20. The hollow section 22 has an opening at the lower end of the rotary shaft 20 to form a lower end opening 24.

At the lower end of the rotary shaft 20, there is mounted a pressure reduction control means 26, e.g., a pressure reduction control valve, in the example of the figures. The pressure reduction control means 26 can control a rate of air flowing through the hollow section 22 in the rotary shaft 20 by adjusting a degree of opening of the hollow section 22 therein. While, in the example shown in the figures, a case is shown in which the pressure reduction control means 26 is mounted at the lower end of the rotary shaft 20, there is not necessarily a limitation to the mounting at the lower end but the pressure reduction control means 26 can be mounted at any position such as an intermediate portion or the upper portion of the rotary shaft 20 since it is only required that a degree of opening of the hollow section 22 is adjusted.

A numerical mark 28 indicates a pulley provided in the lower portion of the rotary shaft 20 and connected to a motor pulley of a motor 30 with a pulley belt 34 extended therebetween. In operation, the motor 30 is activated, the motor pulley 32 is rotated and the rotation is in turn transmitted to the pulley 28 through the pulley belt 34, with the result that the rotary shaft 20 is rotated.

Description will be made of operations of such a construction described above. In a wafer rotary holding apparatus 10 of the invention, there is employed a fluid: for example, a gas such as air, a liquid such as pure water or a chemical liquid, or a mixture thereof, and a case of air as the fluid is taken up in the description.

First of all, a wafer (W), as shown in FIG. 2, is placed above the upper surface of the rotary disk 12 with the wafer rests 18 interposed therebetween, that is, with a gap between the wafer (W) and the upper surface of the rotary disk 12; to be more concrete, above the upper surfaces of the blades 16 with a gap. Then, a degree of opening of the hollow section 22 in the rotary shaft 20 is adjusted by the pressure reduction control means 26 according to a thickness of the wafer (W) so as to create an optimal reduced pressure. It should be appreciated that as the opening of the hollow section 22 is wider, a degree of pressure reduction decreases and vice versa.

The adjustment of pressure reduction can be performed by changing rotation speed of the rotary disk 12 in addition to a change in opening of the hollow section 22. As the rotation speed of the rotary disk 12 is faster, a degree of pressure reduction increases and vice versa.

Furthermore, supply of a fluid, for example air, onto the upper surface of the rotary disk 12 is effected with fluid (air) (A) supply means not shown when a need arises and a degree of pressure reduction can be controlled by adjusting a supply rate of the fluid (air) (A). As supply of the fluid (air) (A) increases, a degree of pressure reduction decreases and vice versa.

In such a situation, when the motor 30 is driven, rotation of the motor 30 is transmitted to the rotary shaft 20 through the motor pulley 32, the pulley belt 34 and the pulley 28, with the result that the rotary disk 12 fixed to the rotary shaft 20 is rotated. With rotation of the rotary disk 12, a fluid (air) (A) on the upper surface of the rotary disk 12 is discharged outwardly by centrifugal force due to the rotation, that is the fluid (air) (A) on the rotary disk 12 is discharged outwardly through a plurality of fluid (air) (A) flow paths 36 formed in spaces between the upper surface of the rotary disk 12 and the lower surface of the wafer (W), partitioned by pairs of blades opposite from each other.

A reduced pressure is created in the fluid (air) (A) flow paths 36 by outward discharge of the fluid (air) (A): By sucking force of the reduced pressure, the fluid (air) (A) taken in from the lower end opening 24 of the hollow section 22 in the rotary shaft 20 is supplied onto the upper surface of the rotary disk 12 passing through the hollow section 22 and the through hole 14, and the fluid (air) (A), subsequent to this, is discharged in a continuous manner outwardly through the fluid (air) (A) flow paths 36, with the result that the reduced pressure continues to be kept in the fluid (air) (A) flow paths 36.

As long as the rotary disk keeps its rotation, the reduced pressure is kept to be present in the fluid (air) (A) flow paths 36. The wafer (W) is fixedly held while rotating on the wafer rests 18 by the periphery thereof by sucking force of the reduced pressure in the fluid (air) flow paths 36. At this time, the rear surface of the wafer (W) is located above the upper surface of the blades 16 with no contact to the upper surface of the blades.

When sucking force of the reduced pressure is excessively strong, there arises a chance of inconvenience where a thin wafer (for example, of 0.1 mm or less in thickness) sags in the middle portion. In the invention, however, since a degree of opening of the hollow section 22 in the rotary shaft 20 can be freely regulated by the pressure reduction control means 26, a thin wafer (W) can be fixedly held while rotating on the wafer rests 18 with no sagging, by weakening sucking force through decrease in pressure reduction caused by a wider opening of the hollow section 22.

It should be appreciated that while there are many cases where bow naturally occurs in a wafer as thin as of the order of 100 μm or less, even bow of such a wafer is erased by centrifugal force due to rotation and the wafer can be held while rotating without any trouble when placing the wafer in an intact state having bow on a wafer rotary holding apparatus of the invention and consequently, correction of bow of a wafer is not necessary prior to holding the wafer during rotation as is in a conventional practice, thereby realizing an advantage in that time and labor required for the correction can be saved. Needless to say that since bow of a wafer is not corrected by the holding during rotation, the bow is revived after the rotation is ceased.

While in the example shown in FIGS. 1 and 2, a case is shown in which the blades 16 are erected on the upper surface of the rotary disk 12 in a radial state, curved blades or a curved blade 16 can also be disposed in a radial state as shown in FIG. 3 or in a spiral or volute state as shown in FIG. 4. When the straight blades 16 or the curved blades 16 are provided in a radial state, there are naturally a need to use a plurality of straight or curved blades 16 to form a plurality of fluid flow paths 36, but when the curved blades or blade 16 is provided in a spiral or volute state, a plurality of curved blades 16 may be used, but as shown in FIG. 4 the single blade 16 may be used to form a single fluid flow path 36, thereby enabling such a structure to exert an action and an effect similar to the other examples.

It should be appreciated that while in the example shown in the figures, the blade or blades are erected on the upper surface of the rotary disk 12 as separate body or bodies, the blade or blades 16 can be formed on the upper surface of the rotary disk 12 in one body therewith by grooving the upper surface layer like the fluid flow path or paths 36 to leave a raised portion or portions, left behind, corresponding to the blade or blades 16 on the upper surface of the rotary disk 12 since it is only required to form the fluid flow path or paths 36 on the upper surface of the rotary disk 12 using an action of the blade or blades 16.

Figure 5:
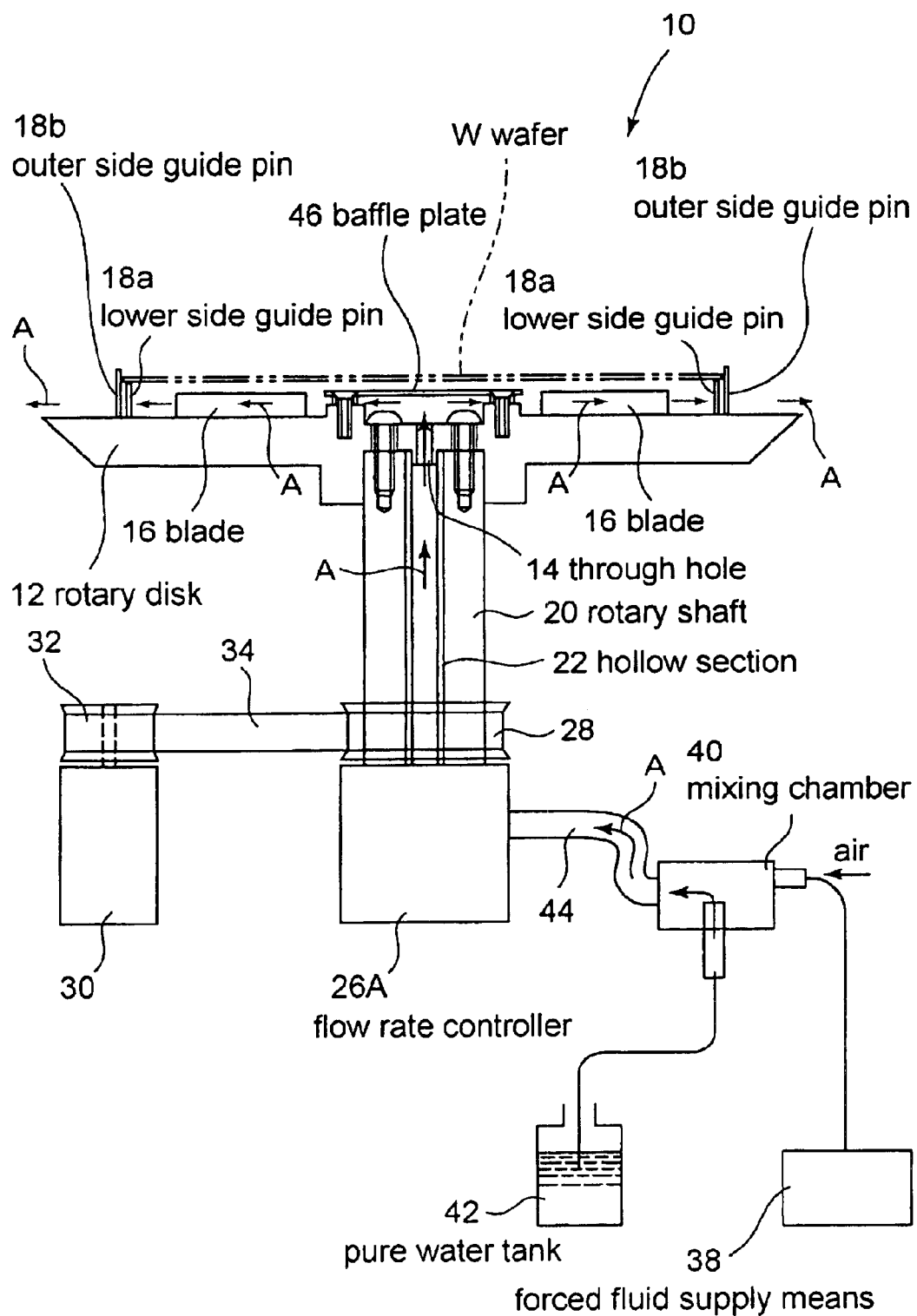
FIG. 5 is a sectional side view showing another embodiment of a wafer rotary holding apparatus of the invention in a simplified manner.
Figure 6:
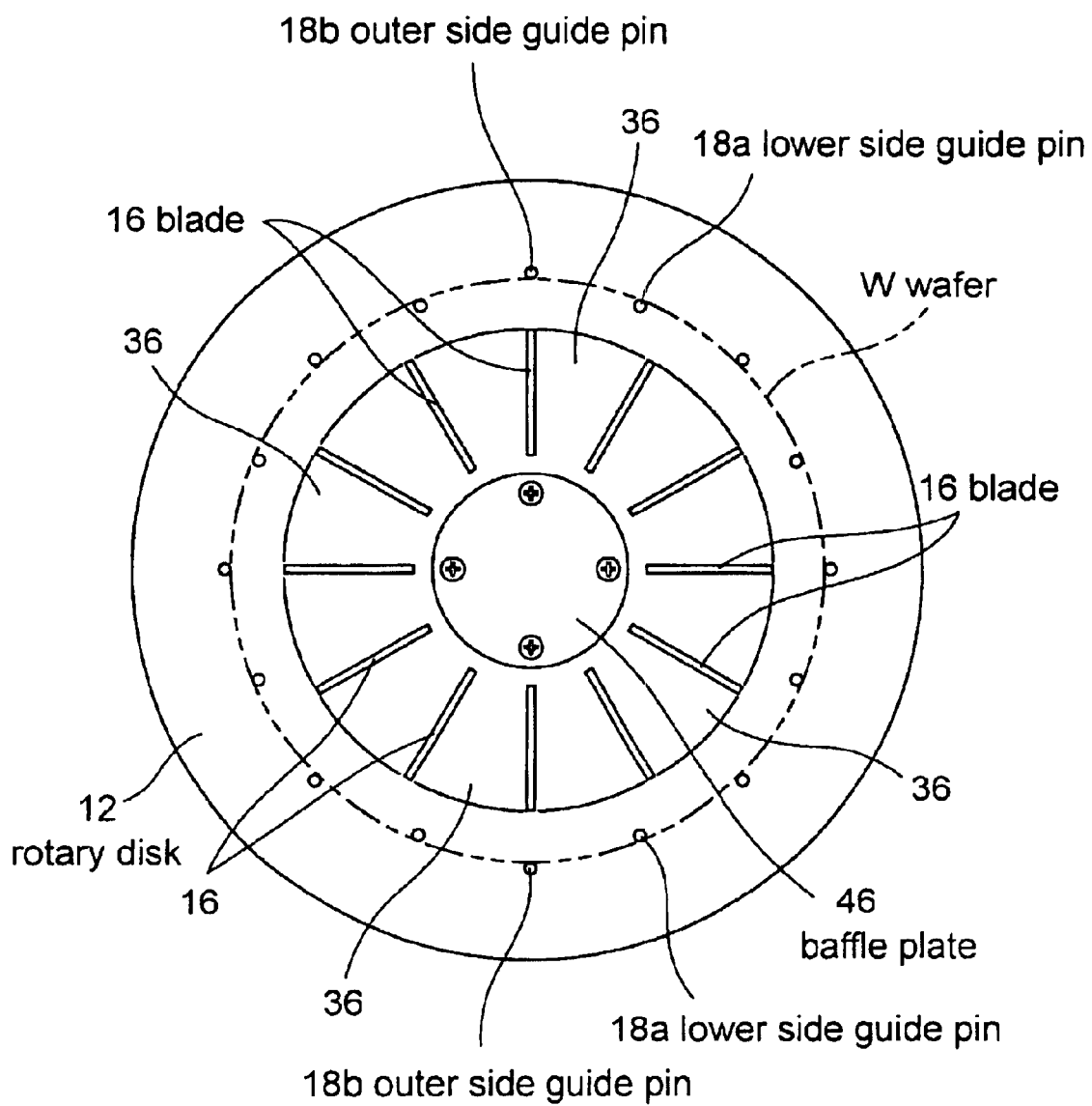
FIG. 6 is an enlarged top view of the rotary view of FIG. 5.
Figure 7:
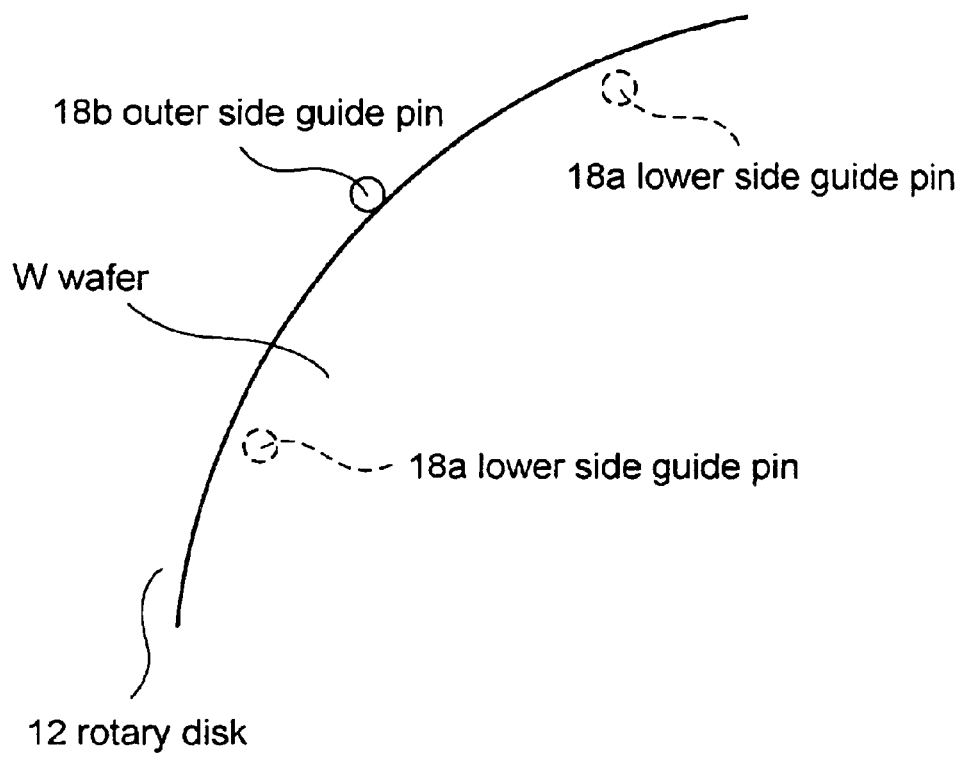
FIG. 7 is a further enlarged view of a main part of the rotary disk of FIG. 6.
Figure 8:
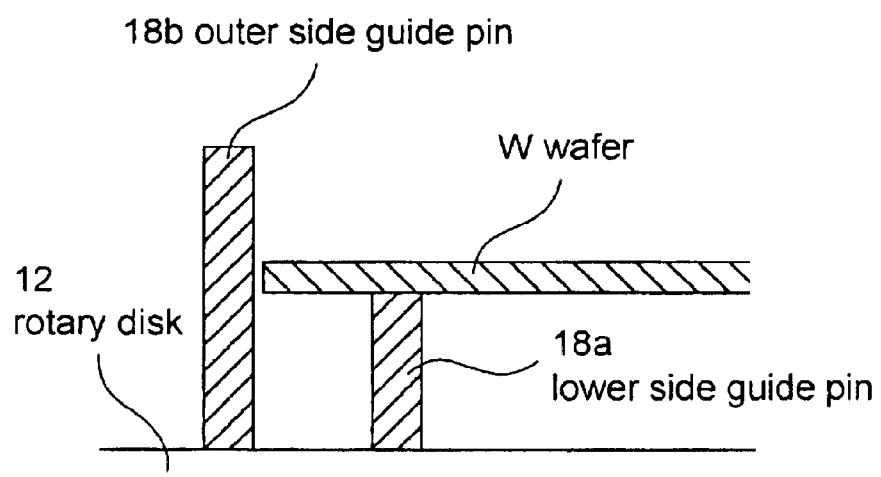
FIG. 8 is a partial cross-sectional view of FIG. 7.

A wafer rotary holding apparatus of the invention can be realized in various ways of modification or alteration other than the examples shown in the figures above, which will be described below. FIG. 5 is a sectional side view showing another embodiment of a wafer rotary holding apparatus of the invention in a simplified manner, FIG. 6 is an enlarged top view of the rotary disk of FIG. 5, FIG. 7 is a further enlarged view of a main part of the rotary disk of FIG. 6 and FIG. 8 is a partial cross-sectional view of FIG. 7.

In FIGS. 1 and 2, while the case is described in which air is used as the fluid (A), fluids other than air can be used, as described above. In FIG. 5, a case is shown in which there is used pure water mist, as the fluid (A), obtained by mixing pure water and air with each other. In a mixing chamber 40, pure water supplied from a pure water tank 42 and air supplied separately are mixed with each other to form pure water mist (A) composed of pure water and air, and the pure water mist (A) is supplied to a flow rate controller 26A through a conduit 44. The pure water mist (A) whose flow rate is controlled by the flow rate controller 26A is guided onto the upper surface of the rotary disk 12 passing through the hollow section 22 in the rotary shaft 20, similar to the cases of FIGS. 1 and 2.

It should be appreciated that while the air in FIG. 5 may be drawn by sucking force of a reduced pressure created in the fluid flow paths 36 described above, the air in this embodiment is forcibly supplied to the mixing chamber 40 by a fluid forcible supply means 38 such as a compressor or a motor, and therefore, pure water mist (A) obtained by mixing in the mixing chamber 40 is also forcibly supplied to the through hole 14 by way of the conduit 44 and the hollow section 22 under influence of the fluid forcible supply means 38. With such a construction adopted, a chemical liquid supplied onto the upper surface of the wafer in order to treat the upper surface thereof is prevented from creeping over onto the lower surface of the wafer. This effect is achieved by blowing the fluid (A) supplied forcibly, onto the lower surface of the wafer.

In FIG. 5, a numerical mark 46 indicates a baffle plate disposed above the through hole 14 formed in the central section of the rotary disk 12. The fluid (pure water mist) (A) to be supplied onto the upper surface of the rotary disk 12 by way of the through hole 14 is guided in directions of the blades 16 by the baffle plate 46.

With this baffle plate 46 disposed, advantages are enjoyed in that the wafer (W) is prevented from an accident in which the wafer is contaminated by impurities and so on even when impurities are mixed into the fluid (A) since the fluid (A) is not blown directly onto the lower surface of the wafer (W) and further, upward blow-off of the fluid (A) is prevented from occurring even when the wafer is unexpectedly broken during operation.

In the case where as the fluid (A), pure water mist is adopted, back side rinse can be simultaneously performed by pure water mist blown onto the lower surface of the wafer (W) when etching is effected by supplying an etching liquid onto the upper surface of the wafer (W) during rotation.

In this embodiment, the wafer rests 18, as shown in FIGS. 7 and 8, include lower side guide pins 18a receiving the lower surface of the wafer (W) and outer side guide pins 18b receiving the outer side surface of the wafer (W), which is different from the example shown in FIGS. 1 and 2. The construction other than parts described above is similar to that of FIGS. 1 and 2, for which reason, description is not repeated.

With the above construction, similar to the case of FIGS. 1 and 2, when the rotary disk 12 is rotated, a fluid (A) on the upper surface of the rotary disk 12 is discharged outwardly by centrifugal force due to rotation, that is the fluid (A) which has passed through the through hole 14 is guided sideways by the action of the lower surface of the baffle plate 46 and subsequent to this, the fluid (A) on the upper surface of the rotary disk 12 is discharged to the outside through the fluid flow paths 36 formed in spaces between the upper surface of the rotary disk 12 and the lower surface of the wafer (W), partitioned by pairs of blades 16, 16 opposite from each other.

Further, by supplying the fluid (A) forcibly, as described above, the fluid (A) is intentionally blown onto the lower surface of the wafer and a chemical liquid such as an etching liquid, which is supplied onto the upper surface of the wafer, can be prevented from creeping over onto the lower surface of the wafer. Needless to say that forced supply of the fluid (A) can be effected, independently of whether or not the baffle plate 46 is present.

Figure 9:
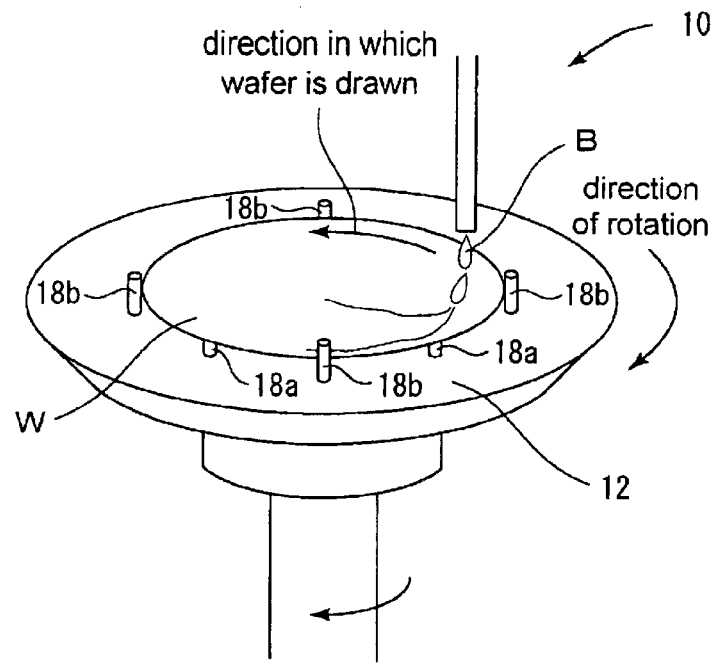
FIG. 9 is a top plan view showing a state of a wafer and a wafer rotary holding apparatus between which a displacement of rotation occurs when a chemical liquid or the like is poured onto the upper surface of the wafer held during rotation on the wafer rotary holding apparatus.

In a wafer rotary holding apparatus of the invention, when a chemical liquid (B) or the like is poured onto the upper surface of a wafer (W) held during rotation, the wafer is pulled in a direction opposite from a direction of rotation of the rotary holding apparatus 10 by the action of viscosity of the chemical liquid (B) or the like, which causes a difference in rotation speed between the wafer (W) and the rotary holding apparatus 10 (FIG. 9). With such a difference in rotation speed, many problems occurs: injuries due to increase in friction of contact between the lower surface of the wafer and the lower side guide pins caused by the displacement of rotation; fluctuations in a state after an etching treatment or the like of the wafer due to uneven rotation of the wafer; increase in creeping of the chemical liquid (B) or the like over onto the lower surface of the wafer due to decrease in centrifugal force caused by reduction in rotation speed of the wafer; and other troubles.

Figure 10:
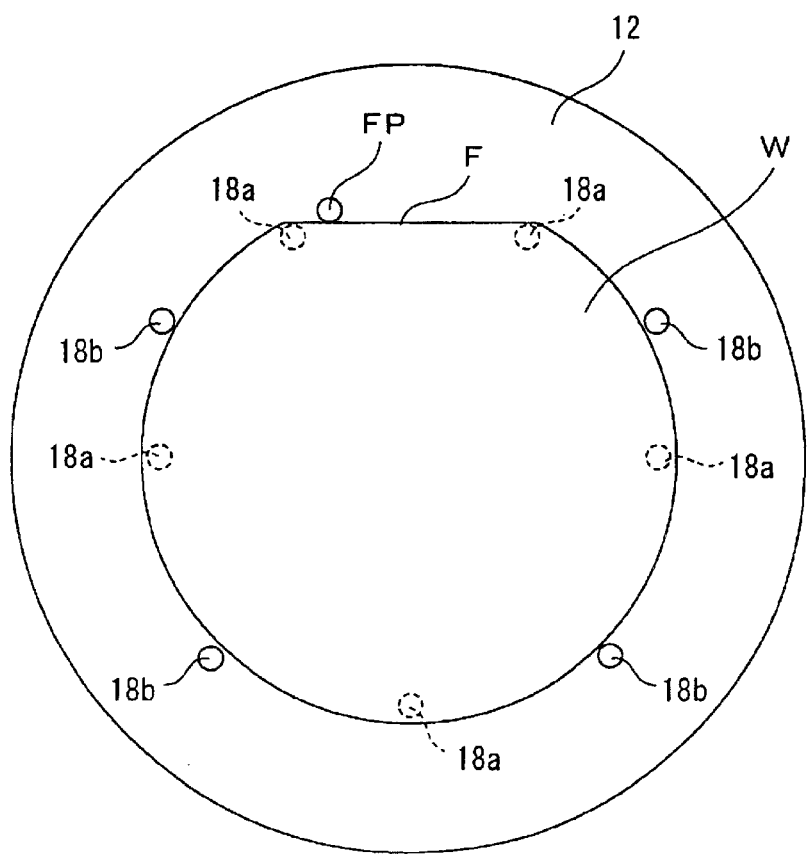
FIG. 10 is a top plan view showing a state of a wafer whose orientation flat engages with an orientation flat stopper pin erected on a rotary disk.
Figure 11:
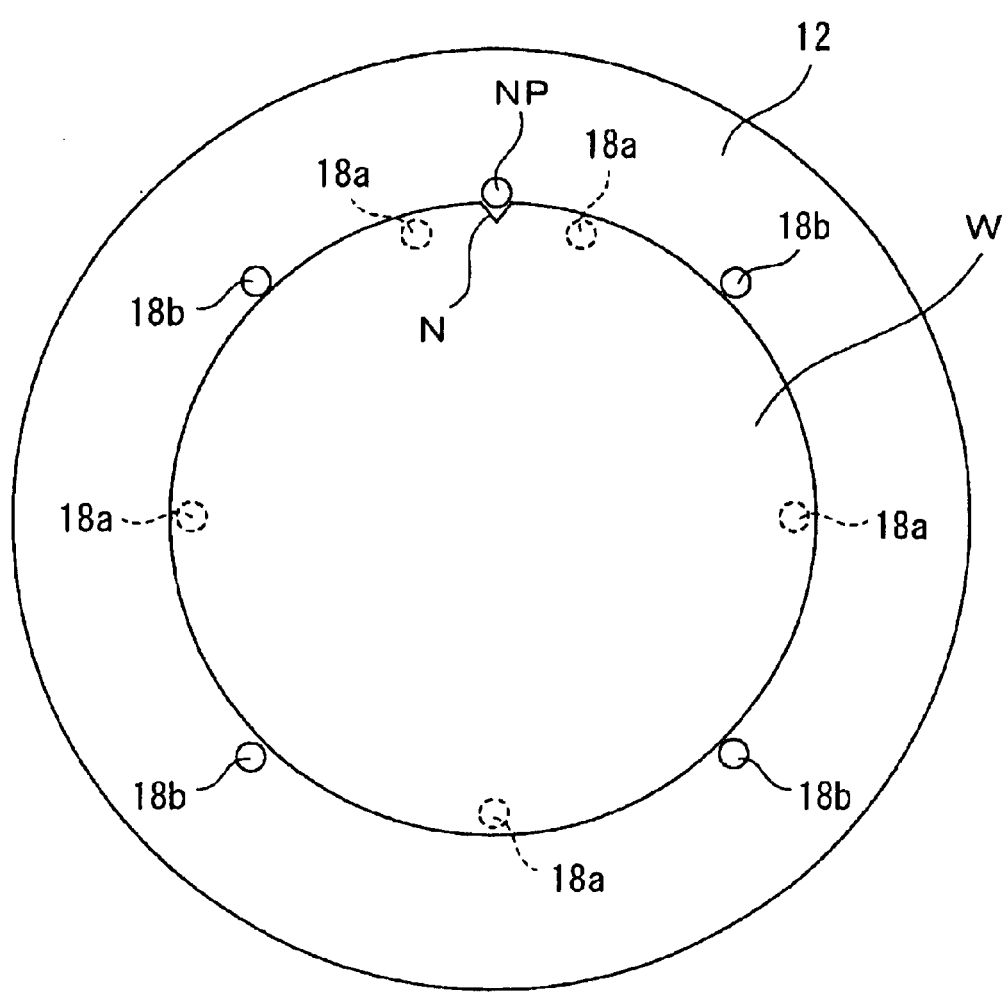
FIG. 11 is a top plan view showing a state of a wafer whose notch engages with a notch stopper pin erected on a rotary disk.

In order to prevent such problems, an orientation flat receiver (FP) being put into contact with a orientation flat (F) of a wafer (W), for example an orientation flat stopper pin (FIG. 10), and a notch receiver (NP) being put into contact with a notch (N) of the wafer (W), for example a notch stopper pin (FIG. 11), are erected on the upper surface of the rotary disk 12 and thereby, no displacement of rotation arises between the wafer (W) and the rotary holding apparatus 10, with the result that neither of the problems caused by the difference in rotation speed occurs.

Such a wafer rotary holding apparatus of the invention can be preferably employed in apparatuses, such as a spin-etching apparatus, a spin-drying apparatus, a spin-coating apparatus and the like apparatuses, in which a wafer is treated while rotating.

Figure 12:
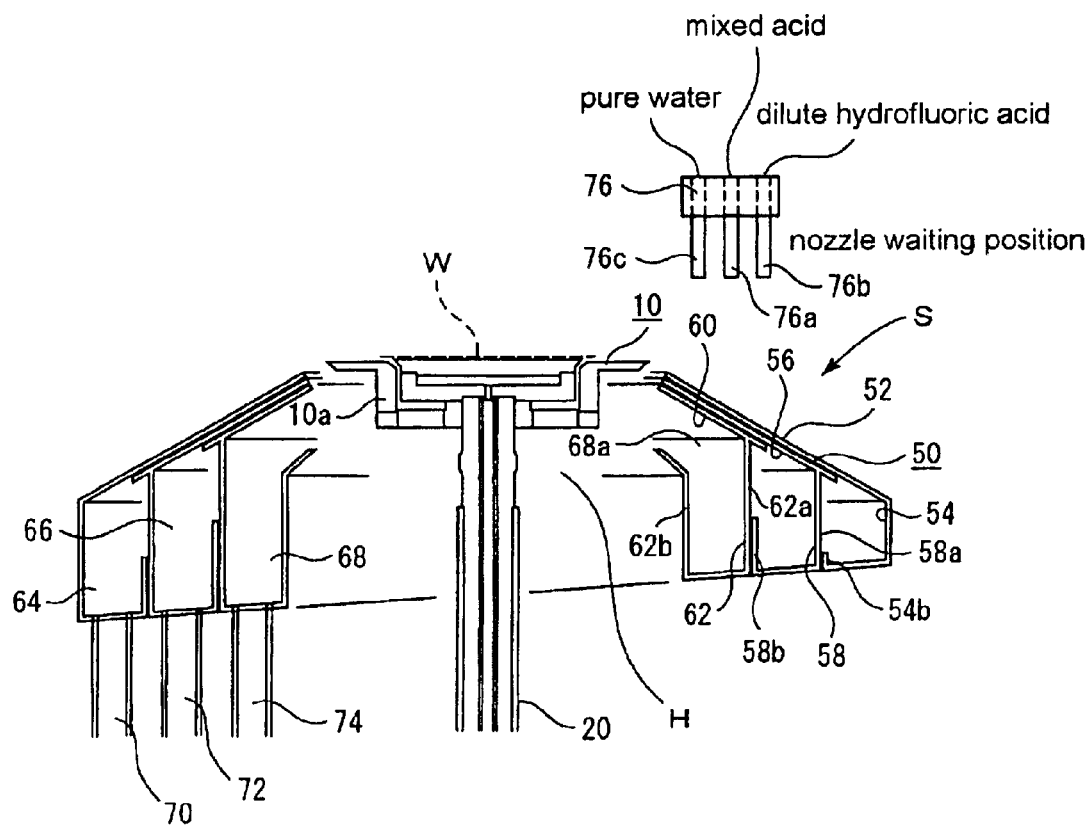
FIG. 12 is a sectional side view of a wafer surface treatment apparatus with a waste liquid recovery mechanism of the invention in a simplified manner.
Figure 13:
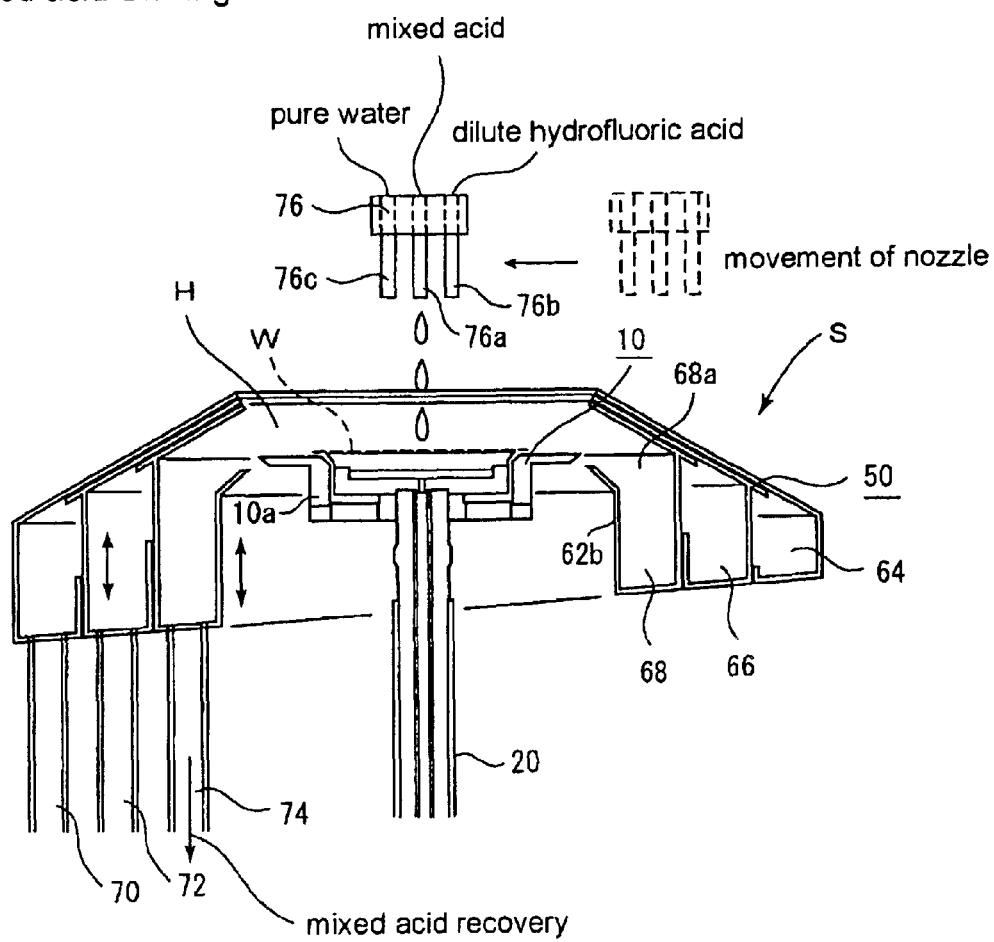
FIG. 13 is a sectional side view of the wafer surface treatment apparatus showing a state of the apparatus when the whole of the waste liquid recovery mechanism is raised from the state of FIG. 12 in a simplified manner.
Figure 14:
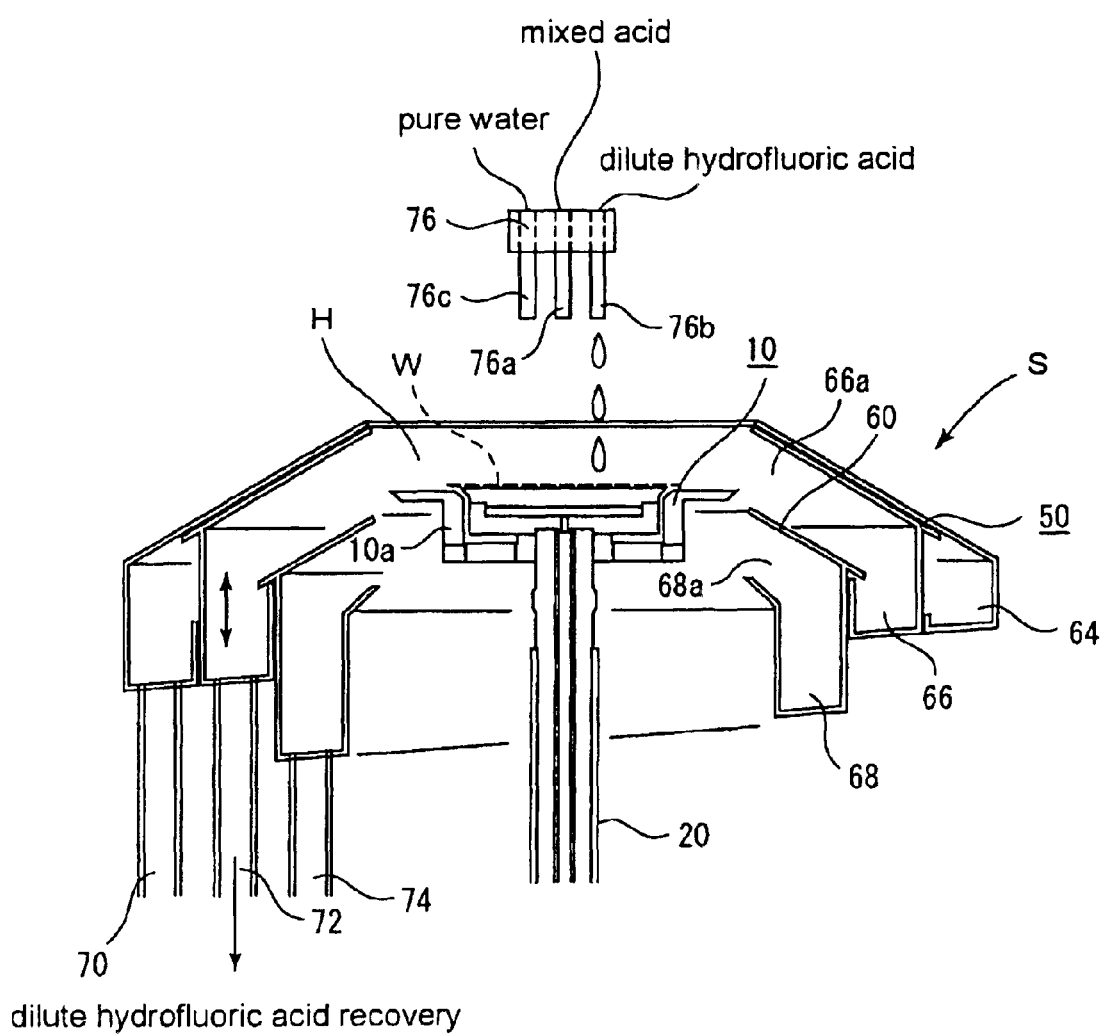
FIG. 14 is a sectional side view of the wafer surface treatment apparatus showing a state of the apparatus when only the inner side waste liquid recovery trough is moved downward from the state of FIG. 13 in a simplified manner.
Figure 15:
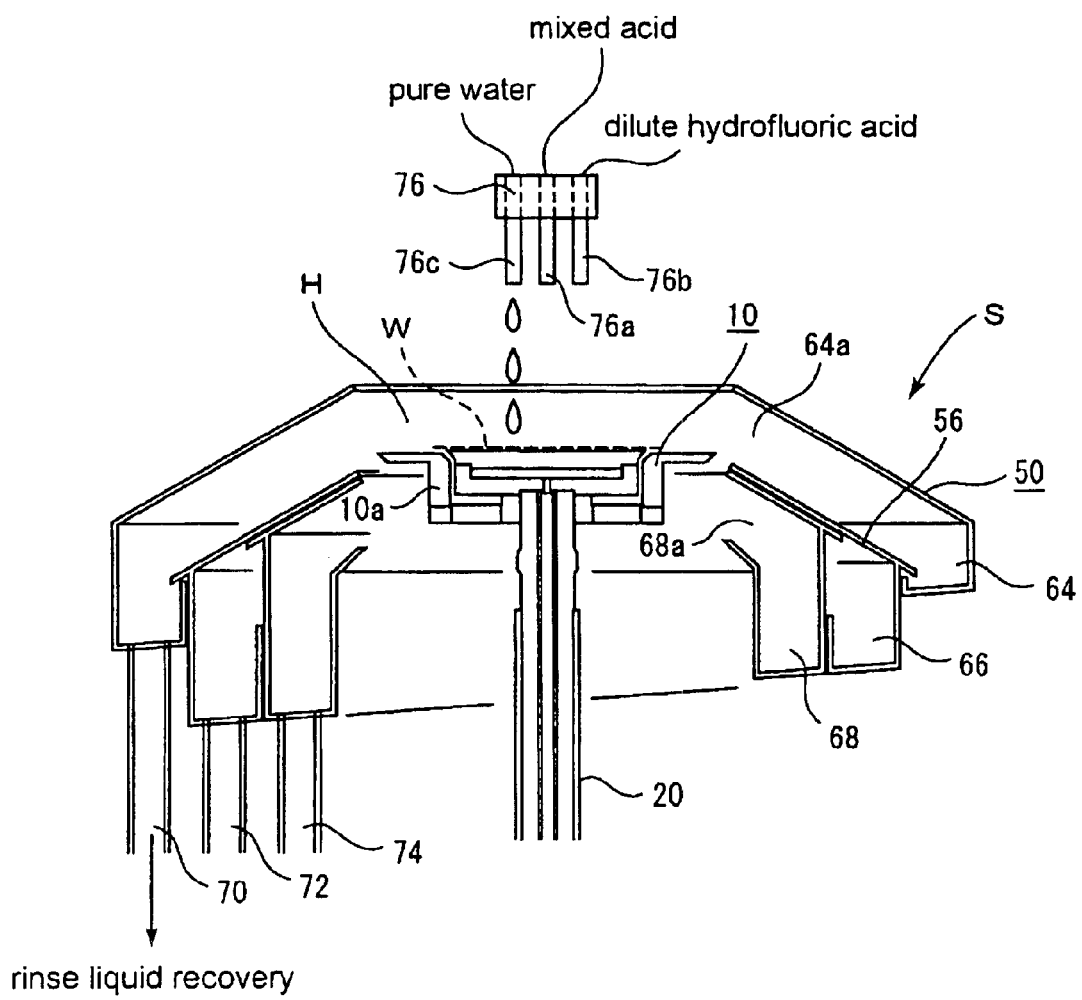
FIG. 15 is a sectional side view of the wafer surface treatment apparatus showing a state of the apparatus when only the intermediate waste liquid recovery trough is moved downward from the state of FIG. 14 in a simplified manner.

FIG. 12 is a sectional side view of a wafer surface treatment apparatus with a waste liquid recovery mechanism of the invention in a simplified manner and shows a state where a wafer is loaded or unloaded. FIG. 13 is a sectional side view of the wafer surface treatment apparatus showing a state of the apparatus, in a simplified manner, when the whole of the waste liquid recovery mechanism is raised from the state of FIG. 12 and the inner side waste liquid recovery trough is used. FIG. 14 is a sectional side view of the wafer surface treatment apparatus showing a state of the apparatus, in a simplified manner, when only the inner side waste liquid recovery trough is moved down from the state of FIG. 13 and the intermediate waste liquid recovery trough is used. FIG. 15 is a sectional side view of the wafer surface treatment apparatus showing a state of the apparatus, in a simplified manner, when only the intermediate waste liquid recovery trough is moved down from the state of FIG. 14 and the outer side waste liquid recovery trough is used.

In FIGS. 12 to 15, an alphabetical mark (S) indicates a wafer surface treatment apparatus with a waste liquid recovery mechanism of the invention, including: an annular waste liquid recovery mechanism 50 whose central section is a hollow section (H); and a wafer rotary holding apparatus 10 disposed in the interior of the hollow section (H). The wafer rotary holding apparatus 10 includes: a wafer holder 10a; and a rotary shaft 20 supporting the wafer holder 10a in a freely rotatable manner. The waste liquid recovery mechanism 50 includes: an annular outer inclined member 52 extending outwardly with a downward inclination; and an outer corner cylindrical section 54 formed by bending inwardly the distal end portion of the outer inclined member 52. Inside the outer inclined member 52, there are provided an intermediate inclined member 56 in an inclined state similar to the outer inclined member 52; and an intermediate corner cylindrical section 58 formed by bending inwardly the distal end portion of the intermediate inclined member 56. Still inside the intermediate inclined member 56, there are provided an inner inclined member 60 in an inclined state similar to the intermediate inclined member 56; and an inner corner cylindrical section 62 formed by bending inwardly the distal end portion of the inner inclined member 60.

The outer inclined member 52 and the outer corner cylindrical section 54 can be vertically movable and therefore, the whole of the waste liquid recovery mechanism 50 is vertically movable relative to the wafer rotary holding apparatus 10. The intermediate inclined member 56 and the intermediate corner cylindrical section 58 are assembled so as to be vertically movable relative to the outer inclined member 52 and the outer corner cylindrical section 54, wherein the outer surface of the intermediate inclined member 56 is kept in contact with the inner surface of the outer inclined member 52, and the outer surface of the outer wall 58a of the intermediate corner cylindrical section 58 is kept in a slidable contact with the outer surface of the inner wall 54b of the outer corner cylindrical section 54.

The inner inclined member 60 and the inner corner cylindrical section 62 are vertically movable relative to the intermediate inclined member 56 and the intermediate corner cylindrical section 58, the outer surface of the inner inclined member 60 is kept in contact with the inner surface of the intermediate inclined member 56 and the outer surface of the outer wall 62a of the inner corner cylindrical section 62 is kept in slidable contact with the outer surface of the inner wall 58b of the intermediate corner cylindrical section 58.

The outer side annular waste liquid recovery trough 64 is formed with the outer inclined member 52, the outer corner cylindrical section 54, and parts of the intermediate inclined member 56 and the outer wall 58a of the intermediate corner cylindrical section 58. The intermediate annular waste liquid recovery trough 66 is formed with the intermediate inclined member 56, the intermediate corner cylindrical section 58, and parts of the inner inclined member 60 and the outer wall 62a of the inner corner cylindrical section 62. The inner side annular waste liquid recovery trough 68 is formed with the inner inclined member 60 and the inner corner cylindrical section 62.

Therefore, the waste liquid recovery mechanism 50 includes a plurality of the annular waste liquid recovery troughs 64, 66 and 68 (3 pieces in the example shown in the figures) and the waste liquid recovery troughs 64, 66 and 68 are mounted in a vertically movable manner relative to one another. The bottoms of the waste liquid recovery troughs 64, 66 and 68 are inclined in one direction and waste liquid recovery pipes 70, 72 and 74 are each provided at the lowest portion of the inclination. A numerical mark 76 indicates treatment liquid pouring means pouring a chemical liquid or a cleaning liquid and the treatment liquid pouring means includes a plurality of pouring pipes 76a, 75b and 76c (3 pieces in the example shown in the figures) vertically disposed.

Operations in the wafer surface treatment apparatus (S) with the waste liquid recovery mechanism of the invention will be described according to the above described construction; for example, when mixed acid etching, dilute hydrofluoric acid etching and rinse cleaning are each performed. First of all, the waste liquid recovery mechanism 50, as shown in FIG. 12, is positioned such that the uppermost end of the inner side of the outer inclined member 52 assumes a height thereof a little lower than the holding position of a wafer (W) of the wafer rotary holding apparatus 10. In this situation, the wafer (W) is held in place on the wafer rotary holding apparatus 10.

Then, when the mixed acid etching is carried out, the whole of the waste liquid recovery mechanism 50, as shown in FIG. 13, is raised such that the upper end of the inner wall 62b of the inner corner cylindrical section 62 is positioned in the vicinity of the holding position of the wafer (W) of the wafer rotary holding apparatus 10. In this situation, the wafer is rotated and the mixed acid etching is simultaneously performed by pouring aqueous mixed acid solution (hereinafter simply referred to as mixed acid) onto the upper surface of the wafer (W) during rotation from the pouring pipe 76a for the mixed acid after the treatment liquid pouring means 76 is moved to a pouring position thereof. At this time, the mixed acid having been poured on the upper surface of the wafer (W) is made to fly off outwardly by centrifugal force of the wafer (W) during rotation and the used mixed acid moving in the air is collected within the inner side waste liquid recovery trough 68 through an opening 68a and subsequent to this, thus collected used mixed acid flows down along the inclination of the bottom of the inner side waste liquid recovery trough 68 to be eventually recovered through the waste liquid recovery pipe 74 for used mixed acid.

When dilute hydrofluoric acid etching is carried out, the inner inclined member 60 and the inner corner cylindrical section 62, as shown in FIG. 14, are moved down from the state of FIG. 13 such that the upper end of the inner inclined member 60 is positioned in the vicinity of the holding position of the wafer (W) of the wafer rotary holding apparatus 10. In this situation, the wafer (W) is rotated and the dilute acid etching is simultaneously performed by pouring the aqueous dilute hydrofluoric acid solution (hereinafter simply referred to as dilute hydrofluoric acid) onto the upper surface of the wafer (W) during rotation from the pouring pipe 76b for the dilute hydrofluoric acid of the treatment liquid pouring means 76. At this time, the dilute hydrofluoric acid having been poured on the upper surface of the wafer (W) is made to fly off outwardly by centrifugal force of the wafer (W) during rotation and the used dilute hydrofluoric acid moving in the air is collected within the intermediate waste liquid recovery trough 66 through an opening 66a and subsequent to this, thus collected used dilute hydrofluoric acid flows down along the inclination of the bottom of the intermediate waste liquid recovery trough 66 to be eventually recovered through the waste liquid recovery pipe 72 for used dilute hydrofluoric acid.

When rinse cleaning is carried out, the intermediate inclined member 56 and the intermediate corner cylindrical section 58, as shown in FIG. 15, are moved down from the state of FIG. 14 such that the upper end of the intermediate inclined member 56 is positioned in the vicinity of the holding position of the wafer (W) of the wafer rotary holding apparatus 10. In this situation, the wafer (W) is rotated and the rinse cleaning is simultaneously performed by pouring pure water onto the upper surface of the wafer (W) during rotation from the pouring pipe 76c for the pure water of the treatment liquid pouring means 76. At this time, the pure water having been poured on the upper surface of the wafer (W) is made to fly off outwardly by centrifugal force of the wafer (W) during rotation and the used pure water moving in the air is collected within the outer side waste liquid recovery trough 64 through an opening 64a and subsequent to this, thus collected used pure water flows down along the inclination of the bottom of the outer side waste liquid recovery trough 64 to be eventually recovered through the waste liquid recovery pipe 70 for used rinse liquid.

After the mixed acid etching, the dilute hydrofluoric acid etching and the rinse cleaning are finished, not only are the intermediate inclined member 56, the intermediate corner cylindrical section 58, the inner inclined member 60 and the inner corner cylindrical section 62 raised, but the whole of the waste liquid recovery mechanism 50 is moved down such that the uppermost end of the inner side of the outer inclined member 52, as shown in FIG. 12, assumes a height thereof a little lower than the holding position of a wafer (W) of the wafer rotary holding apparatus 10. In this situation, the wafer (W) is taken out from the wafer rotary holding apparatus 10.

While, as the wafer rotary holding apparatus 10, publicly well known chuck means holding a wafer during rotation in the prior art may be used, the novel wafer rotary holding apparatus 10 of the invention described above is preferably employed.

According to a wafer rotary holding apparatus of the invention, as described above, effects can be exerted that a reduced pressure is created on the upper surface of a rotary disk using a simple, easy-to-make mechanism with no need of any of a vacuum source apparatus, a compressed air supply apparatus, a compressed gas supply apparatus and other apparatuses in use; a wafer can be held while rotating with no contact to the rear surface thereof; and a degree of pressure reduction can be adjusted with ease and even a thin wafer (of 0.1 mm or less in thickness) can be held while rotating with no deformation.

According to a wafer surface treatment apparatus of the invention, effects can be exerted that a plurality of wastes liquids, especially three or more kinds of waste liquids, can be separately recovered in a continuous, effective manner according to kinds of a treatment liquid and a cleaning liquid, and therefore productivity can be increased; and furthermore a very thin wafer of 100 $\mu$m or less in thickness can be held while rotating using only contacts with the periphery of the wafer; and in addition cleaning using a ultra-sonic jet nozzle and brush cleaning can also be employed.

Obviously, various minor changes and modifications of the present invention are possible in the light of the above teaching. It is therefore to be understood that within the scope of the appended claims the invention may be practiced otherwise than as specifically described.

What is claimed is:

1. A wafer surface treatment apparatus with a waste liquid recovery mechanism used for treating a surface of a wafer with each of a treatment liquid and a cleaning liquid, comprising: a wafer rotary holding apparatus holding a to-be-treated wafer while rotating; and a waste liquid recovery mechanism provided around the periphery of the wafer rotary holding apparatus in a vertically movable manner, wherein the waste liquid recovery mechanism is constructed of a plurality of annular waste liquid recovery troughs which are vertically movable relative to each other or one another and the annular waste liquid recovery troughs are selectively used according to kinds of the treatment liquid and the cleaning liquid, such that the respective waste liquids are separately recovered.

2. A wafer surface treatment apparatus according to claim 1, wherein three annular waste liquid recovery troughs are employed.

3. A wafer surface treatment apparatus according to claim 1, wherein the wafer rotary holding apparatus further comprises:

a rotary disk on which fluid flow path is formed;

a through hole formed in a central section of the rotary disk; and a plurality of wafer rests provided on an upper surface of the rotary disk, wherein a wafer is placed on the wafer rests, above the rotary disk with a gap therebetween, and wherein when the rotary disk is rotated, a fluid in the fluid flow path is discharged outwardly by centrifugal force due to rotation, thereby a reduced pressure is created in the fluid flow path and kept as far as the rotary disk is rotated, through a process in which a fluid is drawn by sucking force of the reduced pressure from the lower surface side of the rotary disk through the through hole, and the fluid drawn is supplied onto the upper surface of the rotary disk to be outwardly discharged in a continuous manner passing through the fluid flow path, with the result that the wafer is drawn downwardly by the sucking force of the reduced pressure and fast held on the wafer rests while rotating.

4. A wafer surface treatment apparatus according to claim 3, further comprising:

fluid supply means for supplying a fluid forcibly through the through hole from the lower surface side of the rotary disk, wherein the fluid is supplied through the through hole in a forced manner from the lower surface side of the disk while keeping the reduced pressure.

\* \* \* \* \*